United States Patent
Rudolph et al.

(10) Patent No.: US 11,094,844 B2
(45) Date of Patent: Aug. 17, 2021

(54) OPTOELECTRONIC SEMICONDUCTOR CHIP WITH TWO SEPARATE LIGHT EMITTING LAYERS

(71) Applicant: OSRAM Opto Semiconductors GmbH, Regensburg (DE)

(72) Inventors: Andreas Rudolph, Regensburg (DE); Markus Broell, Cork (IE); Wolfgang Schmid, Gundelshausen (DE); Johannes Baur, Regensburg (DE); Martin Rudolf Behringer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 15 days.

(21) Appl. No.: 16/482,487

(22) PCT Filed: Feb. 22, 2018

(86) PCT No.: PCT/EP2018/054400
§ 371 (c)(1),
(2) Date: Jul. 31, 2019

(87) PCT Pub. No.: WO2018/153994
PCT Pub. Date: Aug. 30, 2018

(65) Prior Publication Data
US 2019/0371966 A1    Dec. 5, 2019

(30) Foreign Application Priority Data
Feb. 24, 2017  (DE) ..................... 10 2017 103 856.6

(51) Int. Cl.
*H01L 33/08* (2010.01)
*H01L 33/00* (2010.01)
(Continued)

(52) U.S. Cl.
CPC .......... *H01L 33/08* (2013.01); *H01L 33/0025* (2013.01); *H01L 33/06* (2013.01); *H01L 33/14* (2013.01); *H01L 33/30* (2013.01)

(58) Field of Classification Search
CPC ...................................................... H01L 33/08
(Continued)

(56) References Cited

U.S. PATENT DOCUMENTS 5,699,375 A    12/1997  Paoli
6,476,411 B1   11/2002  Ohno et al.
(Continued)

FOREIGN PATENT DOCUMENTS

DE          697 09 581 T2    8/2002
DE    10 2004 004 781 A1    8/2005
(Continued)

OTHER PUBLICATIONS

Notification of Reason for Refusal dated Oct. 22, 2020, of counterpart Korean Application No. 10-2019-7024064, with English translation.
(Continued)

*Primary Examiner* — Ajay Arora
(74) *Attorney, Agent, or Firm* — DLA Piper LLP (US)

(57) ABSTRACT

An optoelectronic semiconductor chip includes a p-type semiconductor region, an n-type semiconductor region, an active layer disposed between the p-type semiconductor region and the n-type semiconductor region and formed as a multiple quantum well structure and having alternating quantum well layers and barrier layers, the quantum well layers emitting a first radiation in a first wavelength range, and at least one further quantum well layer disposed outside the multiple quantum well structure that emits a second radiation in a second wavelength range, wherein the first wavelength range is in an infrared spectral range invisible to
(Continued)

a human eye, and the second wavelength range includes wavelengths at least partially visible to the human eye.

16 Claims, 3 Drawing Sheets

(51) Int. Cl.
  *H01L 33/06* (2010.01)
  *H01L 33/14* (2010.01)
  *H01L 33/30* (2010.01)
(58) Field of Classification Search
  USPC .............................................. 257/13
  See application file for complete search history.

(56) References Cited

U.S. PATENT DOCUMENTS

| | | | |
|---|---|---|---|
| 10,217,896 B2 | 2/2019 | Rudolph et al. | |
| 2004/0218654 A1* | 11/2004 | Kneissl | B82Y 20/00 |
| | | | 372/94 |
| 2005/0207461 A1 | 9/2005 | Philippens et al. | |
| 2008/0265789 A1 | 10/2008 | Bertram et al. | |
| 2011/0133156 A1 | 6/2011 | Won et al. | |
| 2016/0087142 A1 | 3/2016 | Meyer et al. | |
| 2016/0109108 A1* | 4/2016 | Sommerschuh | F21S 41/19 |
| | | | 362/549 |

FOREIGN PATENT DOCUMENTS

| | | |
|---|---|---|
| DE | 10 2007 015 233 A1 | 10/2008 |
| DE | 10 2013 104 351 A1 | 10/2014 |
| DE | 10 2014 117 611 A1 | 6/2016 |
| JP | H08-335718 A | 12/1996 |
| JP | 2001-144382 | 5/2001 |
| JP | 2005-101853 A | 4/2005 |
| JP | 2005101853 A * | 4/2005 |
| KR | 10-2014-0065340 A | 5/2014 |
| WO | 2006/062560 A1 | 6/2006 |

OTHER PUBLICATIONS

Korean Notice of Allowance dated May 24, 2021, of counterpart Korean Application No. 10-2019-7024064, with English translation.

* cited by examiner

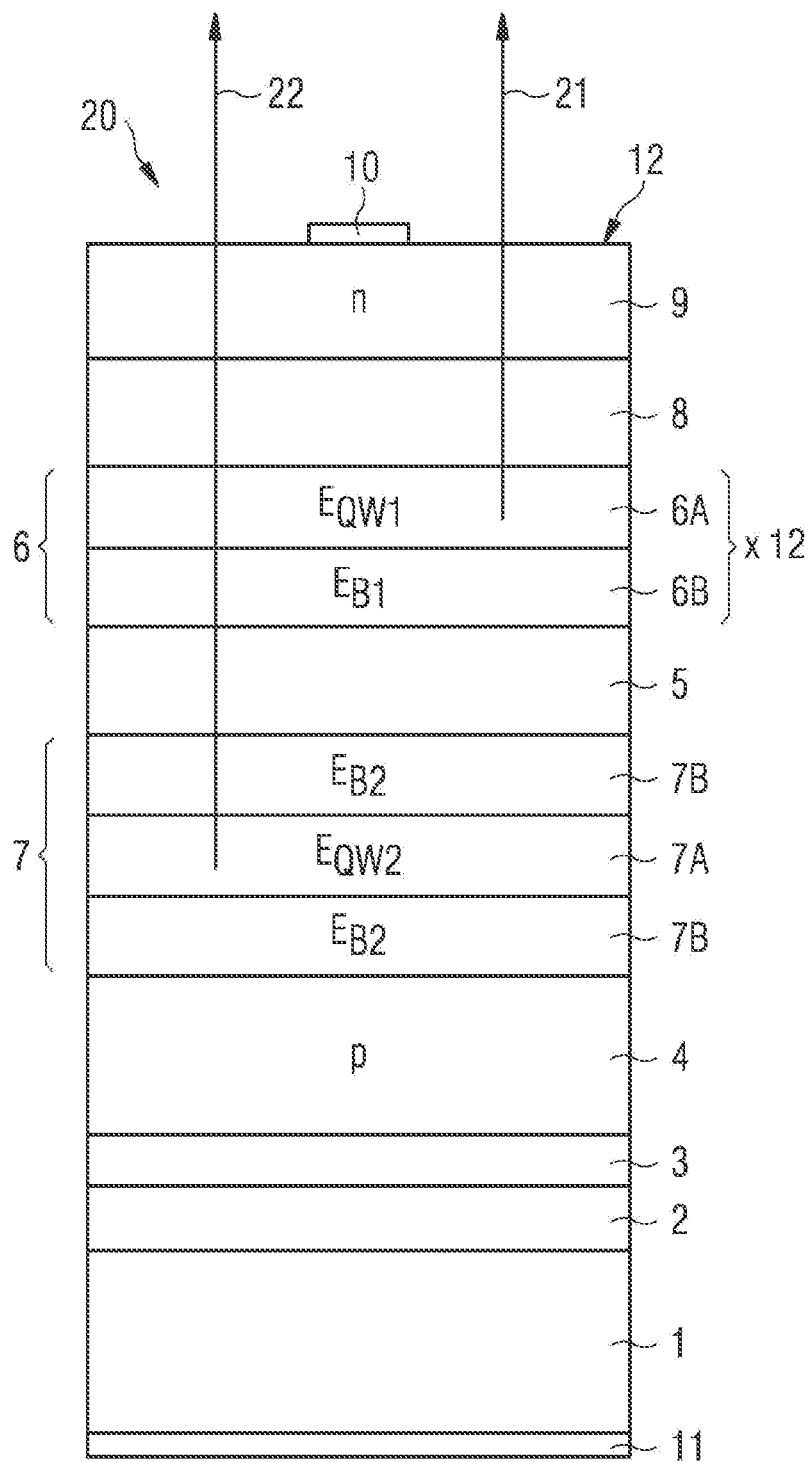

OPTOELECTRONIC SEMICONDUCTOR CHIP WITH TWO SEPARATE LIGHT EMITTING LAYERS

TECHNICAL FIELD

This disclosure relates an optoelectronic semiconductor chip, in particular, an optoelectronic semiconductor chip suitable for the emission of infrared radiation.

BACKGROUND

Optoelectronic semiconductor chips that emit infrared radiation with a high power density involve the risk that body parts, in particular the eyes, are exposed to high radiation power and thus damaged. This danger exists with applications of infrared radiation emitting optoelectronic semiconductor chips in particular because the infrared radiation is not visible to the human eye.

It could therefore be helpful to provide an infrared radiation emitting optoelectronic semiconductor chip that, when operated, reduces the risk of body parts, in particular the eyes, being damaged by infrared radiation.

SUMMARY

We provide an optoelectronic semiconductor chip including a p-type semiconductor region, an n-type semiconductor region, an active layer disposed between the p-type semiconductor region and the n-type semiconductor region and formed as a multiple quantum well structure and having alternating quantum well layers and barrier layers, the quantum well layers emitting a first radiation in a first wavelength range, and at least one further quantum well layer disposed outside the multiple quantum well structure that emits a second radiation in a second wavelength range, wherein the first wavelength range is in an infrared spectral range invisible to a human eye, and the second wavelength range includes wavelengths at least partially visible to the human eye.

We also provide an optoelectronic semiconductor chip including a p-type semiconductor region, an n-type semiconductor region, an active layer disposed between the p-type semiconductor region and the n-type semiconductor region and formed as a multiple quantum well structure and having alternating quantum well layers and barrier layers, the quantum well layers emitting a first radiation in a first wavelength range, and at least one further quantum well layer disposed outside the multiple quantum well structure that emits a second radiation in a second wavelength range, wherein the first wavelength range is in an infrared spectral range invisible to a human eye, the second wavelength range includes wavelengths at least partially visible to the human eye, the second radiation has an intensity maximum at a wavelength of 750 nm to 850 nm, the first radiation has an intensity maximum at a wavelength of 850 nm to 1000 nm, a number of the further quantum well layer(s) provided for emission of the second radiation is 1 to 3, and a number of quantum well layers provided for emission of the first radiation is 3 to 30.

BRIEF DESCRIPTION OF THE DRAWINGS

FIG. 4 shows a a schematic representation of a cross section through an optoelectronic semiconductor chip according to the second example.

Figure 1:
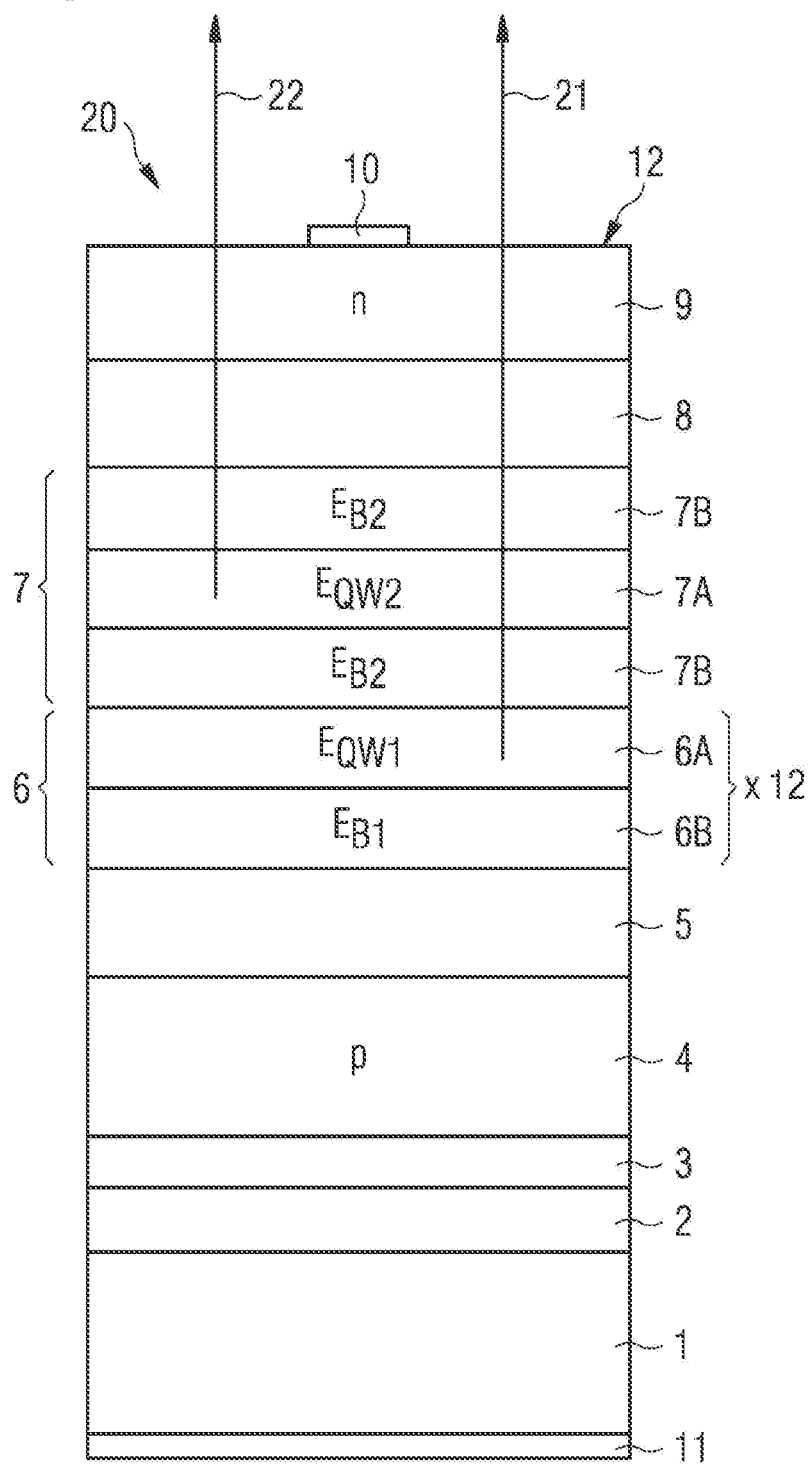
FIG. 1 shows a a schematic representation of a cross section through an optoelectronic semiconductor chip according to a first example.

REFERENCES 1 carrier substrate
2 connection layer
3 mirror layer
4 p-type semiconductor region
5 p-confinement layer
6 multiple quantum well structure
6A quantum well layer
6B barrier layer
7 further quantum well structure
7A further quantum well layer
7B further barrier layer
8 n-confinement layer
9 n-type semiconductor region
10 n-connection layer
11 p-connection layer
12 radiation exit surface
20 semiconductor chip
21 first radiation
22 second radiation

DETAILED DESCRIPTION

Our optoelectronic semiconductor chip comprises, according to at least one configuration, a p-type semiconductor region, an n-type semiconductor region, and an active layer disposed between the p-type semiconductor region and the n-type semiconductor region and formed as a multiple quantum well structure.

The multiple quantum well structure may have alternating quantum well layers and barrier layers. The barrier layers may each have a larger band gap than the quantum well layers. The quantum well layers of the multiple quantum well structure may be suitable for the emission of a first radiation in a first wavelength range. The first wavelength range may lie in the infrared spectral range that is invisible to the human eye. The optoelectronic semiconductor chip can in particular be an infrared radiation emitting diode (IRED). The quantum well layers of the multiple quantum well structure have an electronic band gap $E_{QW1}$ corresponding to an emission wavelength in the infrared spectral range. In particular, all quantum well layers of the multiple quantum well structure have the same electronic band gap $E_{QW1}$.

The optoelectronic semiconductor chip may comprise at least one further quantum well layer arranged outside the multiple quantum well structure and configured to emit a second radiation in a second wavelength range. The second wavelength range may comprise wavelengths at least partially visible to the human eye. The second wavelength range may lie in particular at least partly in the visible range of the electromagnetic spectrum and may comprise at least partly shorter wavelengths than the first wavelength range. For example, the second wavelength range may include red light.

During operation of the optoelectronic semiconductor chip, the first radiation of the multiple quantum well structure and the second radiation of the at least one further quantum well layer are emitted simultaneously. Thus, the optoelectronic semiconductor chip emits on the one hand the first radiation that is not perceptible to the human eye and on the other hand the second radiation that is at least partially perceptible to the human eye. The first radiation emitted by the quantum well layers of the multiple quantum well structure is in particular the usable radiation intended for application of the optoelectronic semiconductor chip.

The second radiation emitted by the additional at least one further quantum well layer is intended to signal that the optoelectronic semiconductor chip emits radiation during operation of the optoelectronic semiconductor chip. In particular, the visible radiation contained in the second wavelength range makes it visible to a user of the optoelectronic semiconductor chip where the emitted radiation impinges. In this way, the danger is reduced that body parts such as the user's eyes in particular are hit unnoticed by the infrared radiation of the optoelectronic semiconductor chip and may thus be damaged. In particular, the visible second radiation can trigger the lid closure reflex of the human eye and thus protect the eye from excessive power consumption by the invisible infrared first radiation.

Advantageously, the second radiation may exhibit an intensity maximum at a wavelength of 750 nm to 850 nm, for example, at about 800 nm. In this example, the maximum intensity of the second radiation lies particularly in the near infrared spectral range and is invisible to the human eye. For the visibility of the second radiation, it is sufficient and advantageous if only the short-wave extensions of the spectrum of the second radiation fall into the visible, in particular the red spectral range. The position of the intensity maximum of the second radiation in the invisible infrared spectral range, in particular 750 nm to 850 nm, has the advantage that the visible part of the emitted second radiation does not become too large, which could possibly impair the functionality of the application of the optoelectronic semiconductor chip. In particular, this prevents the user from being dazzled by the visible radiation.

The first radiation emitted by the multiple quantum well structure preferably has a maximum intensity at a wavelength of 850 nm to 1000 nm. The first radiation intended for application of the optoelectronic semiconductor chip has an emission spectrum with a wavelength range completely within the infrared spectral range not perceptible to the human eye.

The at least one further quantum well layer may have a band gap $E_{QW2}$ larger than the band gap $E_{QW1}$ of the quantum well layers of the multiple quantum well structure. Due to the larger band gap, the emission wavelength range of the second radiation may be shifted towards shorter wavelengths compared to the emission wavelength range of the first radiation. To at least partially shift the wavelength range of the second radiation into the visible range, it is advantageous if the band gap $E_{QW2}$ of the at least one further quantum well layer is at least 0.1 eV larger than the band gap $E_{QW1}$ of the quantum well layers of the multiple quantum well structure. In particular, $E_{QW2}-E_{QW1} \geq 0.1$ eV and preferably $E_{QW2}-E_{QW1} \geq 0.15$ eV holds true.

Preferably, the semiconductor layers of the optoelectronic semiconductor chip are based on an arsenide compound semiconductor, phosphide compound semiconductor or arsenide-phosphide compound semiconductor. In particular, the semiconductor layers may each comprise $In_xAl_yGa_{1-x-y}As_nP_{1-n}$, where $0 \leq x \leq 1$, $0 \leq y \leq 1$ and $x+y \leq 1$ and $0 \leq n \leq 1$. This material does not necessarily have to have a mathematically exact composition according to the above formula. Rather, it may contain one or more dopants and additional components which essentially do not alter the characteristic physical properties of the $In_xAl_yGa_{1-x-y}As_nP_{1-n}$ material. For simplicity's sake, however, the above formula contains only the essential components of the crystal lattice (In, Al, Ga, As, P), even if they may be partially replaced by small amounts of other substances.

In particular, the quantum well layers of the multiple quantum well structure and the at least one further quantum well layer may each contain $In_xAl_yGa_{1-x-y}As$ with $0 \leq x \leq 1$, $0 \leq y \leq 1$ and $x+y \leq 1$.

The band gap of the quantum well layers and the barrier layers arranged between the quantum well layers can be adjusted in particular by the material composition. An increase in the band gap can be achieved by increasing the aluminium content y and/or decreasing the indium content x. The aluminium content y of the further quantum well layer is therefore preferably greater than the aluminium content y of the quantum well layers of the multiple quantum well structure and/or the indium content x of the further quantum well layer is smaller than the indium content x of the quantum well layers of the multiple quantum well structure.

Further advantageously, the at least one further quantum well layer has a smaller thickness than the quantum well layers of the multiple quantum well structure. In this way, an increase in the electronic band gap can be achieved in addition to or as an alternative to changing the material composition. Preferably, the thickness of at least one further quantum well layer does not exceed 5 nm. For example, the at least one further quantum well layer has a thickness of 3 nm to 5 nm.

The at least one further quantum well layer may be arranged on one side of the multiple quantum well structure facing the n-type semiconductor region. In this example, the at least one further quantum well layer may in particular directly adjoin the side of the multiple quantum well structure facing the n-type semiconductor region. The arrangement of at least one further quantum well layer on the side of the multiple quantum well structure facing the n-type semiconductor region has the advantage that only a few holes reach this region and thus only a few charge carriers recombine in this region. The second radiation emitted by the at least one further quantum well layer thus has only an advantageously low intensity. This should be sufficient to show the operating state of the optoelectronic semiconductor chip, but only a small portion of the emitted radiation power contributes to the second radiation.

Alternatively, the at least one further quantum well layer may be arranged on a side of the multiple quantum well structure facing the p-type semiconductor region. In this example, the multiple quantum well structure can be arranged in particular between an n-side confinement layer and a p-side confinement layer, the p-side confinement layer being arranged between the multiple quantum well structure and the at least one further quantum well layer. This arrangement of the at least one further quantum well layer has the advantage that only a few electrons reach this region and thus only a few charge carriers recombine in the further quantum well layer. The second radiation emitted by at least one further quantum well layer is therefore of advantageously low intensity.

The optoelectronic semiconductor chip can have exactly one additional quantum well layer for emission of the at least partially visible second radiation. This can be advantageous to achieve only a low radiation power in the second wavelength range. The majority of the radiation emitted by the optoelectronic semiconductor chip is in the first wavelength range intended for the application. Alternatively, it is also possible that the optoelectronic semiconductor chip contains more than one further quantum well layer for the emission of the second radiation. The number of further quantum well layers intended to emit the second radiation may be 1 to 3. If more than three further quantum well layers are used, the proportion of the total radiation emitted accounted for by the second radiation, which is intended to make the radiation emission visible and not by the useful radiation intended for the application, would be undesirably high.

A number of quantum well layers intended to emit the first radiation may be at least five times, preferably at least ten times, greater than the number of further quantum well layer(s) intended to emit the second radiation. Advantageously, the multiple quantum well structure may have at least 3, preferably at least 6 quantum well layers. The multiple quantum well structure advantageously does not contain more than 30, preferably not more than 18 quantum well layers. Since the number of quantum well layers of the multiple quantum well structure emitting the first radiation is substantially greater than the number of further quantum well layers emitting the second radiation, the radiation of the optoelectronic semiconductor chip is emitted substantially in the first wavelength range provided as useful radiation.

The optoelectronic semiconductor chip can in particular be a high-power infrared diode. The first radiation preferably has a radiant power of at least 4.5 W. For example, the optoelectronic semiconductor chip may have a radiation exit area of 1 mm² or more. An operating current of the optoelectronic semiconductor chip is advantageously 5 A or more.

Our chips are explained in more detail in the following examples in connection with the drawings.

Identical or equivalent elements are represented in the figures with the same reference signs. The components shown and the proportions of the components between them shall not be regarded as true to scale.

The optoelectronic semiconductor chip 20 according to an example shown in FIG. 1 is a luminescence diode chip provided for emission of infrared radiation. In particular, the optoelectronic semiconductor chip 20 is an IR radiation emitting diode (IRED). The optoelectronic semiconductor chip 20 has a p-type semiconductor region 4, an n-type semiconductor region 9 and an active layer 6 suitable for emitting IR radiation between the p-type semiconductor region 4 and the n-type semiconductor region 9. The example of the optoelectronic semiconductor chip 20 is a so-called "thin-film" semiconductor chip, from which a growth substrate originally used for epitaxial growth of the semiconductor layers was detached and instead the semiconductor layer sequence was connected to a carrier substrate 1 different from the growth substrate by a connection layer 2, in particular a solder layer.

In such a thin-film LED chip, the p-type semiconductor region 4 usually faces the carrier substrate 1. A mirror layer 3 is advantageously arranged between the p-type semiconductor region 4 and the carrier substrate 1 that advantageously deflects radiation emitted in the direction of the carrier substrate 1 towards a radiation exit surface 12 of the optoelectronic semiconductor chip 20. The mirror layer 3, for example, is a metal layer containing Ag, Al or Au.

For electrical contacting of the optoelectronic semiconductor chip 20, for example, an n-connection layer 10 can be provided on a partial area of the radiation exit surface 12 and a p-connection layer 11 on a rear side of the carrier substrate 1.

The p-type semiconductor region 4 and the n-type semiconductor region 9 can each be composed of several sublayers and do not necessarily have to consist exclusively of p-doped layers or n-doped layers, but can, for example, also have one or more undoped layers.

As an alternative to the example shown, the optoelectronic semiconductor chip 20 can also have an opposite polarity, i.e., the n-type semiconductor region 9 can face a substrate and the p-type semiconductor region 4 a radiation exit surface 12 of the optoelectronic semiconductor chip (not shown). This is usually true with optoelectronic semiconductor chips in which the growth substrate used for epitaxial growth of the semiconductor layers is not detached, as the n-type semiconductor region is usually first grown on the growth substrate.

The active layer 6 of the optoelectronic semiconductor chip 20 provided for the emission of infrared radiation is formed as a multiple quantum well structure 6A, 6B. The multiple quantum well structure 6A, 6B has a plurality of alternately arranged quantum well layers 6A and barrier layers 6B. In the example shown, the multiple quantum well structure consists of twelve layer pairs of quantum well layers 6A and barrier layer 6B each. In general, the number of layer pairs of the multiple quantum well structure is advantageously 3 to 30, preferably 6 to 18. The quantum well layers 6A preferably have a thickness of 3 nm to 10 nm. The barrier layers 6B adjacent to the quantum well layers 6A advantageously have a thickness of 3 nm to 30 nm, preferably 3 nm to 10 nm and especially preferably 5 nm to 7 nm.

The active layer 6 is arranged between a p-side confinement layer 5 and an n-side confinement layer 8. The confinement layers 5, 8 preferably have a larger electronic band gap than the semiconductor layers contained in the active layer 6 and serve to confine charge carriers (electrons and holes) in the active layer 6 to promote the radiative recombination of the charge carriers in the active layer 6.

In the multiple quantum well structure 6A, 6B, the quantum well layers 6A have a band gap $E_{QW1}$ and the barrier layers 6B have a band gap $E_{B1} > E_{QW1}$. The band gap $E_{QW1}$ of the quantum well layers 6A is chosen such that the quantum well layers 6A are suitable for emission of radiation in the infrared spectral range. In particular, the quantum well layers 6A are suitable for emission of a first radiation 21 in a first wavelength range that lies in the infrared spectral range invisible to the human eye. In particular, the first radiation 21 can have an intensity maximum at a wavelength of 850 nm to 1000 nm.

The optoelectronic semiconductor chip 20 has at least one further quantum well layer 7A arranged outside the multiple quantum well structure 6A, 6B. This means in particular that the quantum well layers 6A of the multiple quantum well structure 6A are arranged only on one side of the at least one further quantum well layer 7A. In the example shown in FIG. 1, the optoelectronic semiconductor chip 20 advantageously contains exactly one further quantum well layer 7A arranged between the multiple quantum well structure 6A, 6B and the n-side confinement layer 8. The at least one further quantum well layer 7A may be adjacent to at least one further barrier layer 7B. The at least one further quantum well layer 7A and the at least one further barrier layer 7B thus form a further quantum well structure 7, which is preferably a single quantum well structure.

The at least one further quantum well layer 7A has an electronic band gap $E_{QW2} > E_{QW1}$ and is suitable for the emission of a second radiation 22 in a second wavelength range. The second wavelength range comprises shorter wavelengths than the first wavelength range so that the second radiation 22 is at least partially visible to the human eye. Preferably $E_{QW2}-E_{QW1}>0.1$ eV, especially $E_{QW2}-E_{QW1}>0.15$ eV holds true.

The second radiation 22 emitted by the at least one further quantum well layer 7A may include in particular visible red light. However, it is not necessary for the entire second radiation 22 to be in the visible spectral range. Rather, it is sufficient and even advantageous if the maximum intensity of the second radiation 22 is in the IR range and only a portion of the second radiation 22 falls into the visible spectral range at wavelengths below the maximum intensity. In this way it is achieved that in the at least one further quantum well layer 7A only little power dissipation occurs. The maximum intensity of the second radiation 22 is preferably in the wavelength range of 750 nm to 850 nm.

The addition of visible radiation to the IR radiation of the active layer 6 by the further quantum well layer 7A provides the advantage that the user can see that the optoelectronic semiconductor chip 20 is in the operating state and emits radiation. This is particularly advantageous for IR luminescence diode chips that emit comparatively high radiation powers to reduce the risk of body parts such as the eyes being exposed to IR radiation undetected. The visible part of the second radiation 22 of the at least one further quantum well layer 7A can advantageously trigger, for example, the eyelid closure reflex.

Figure 2:
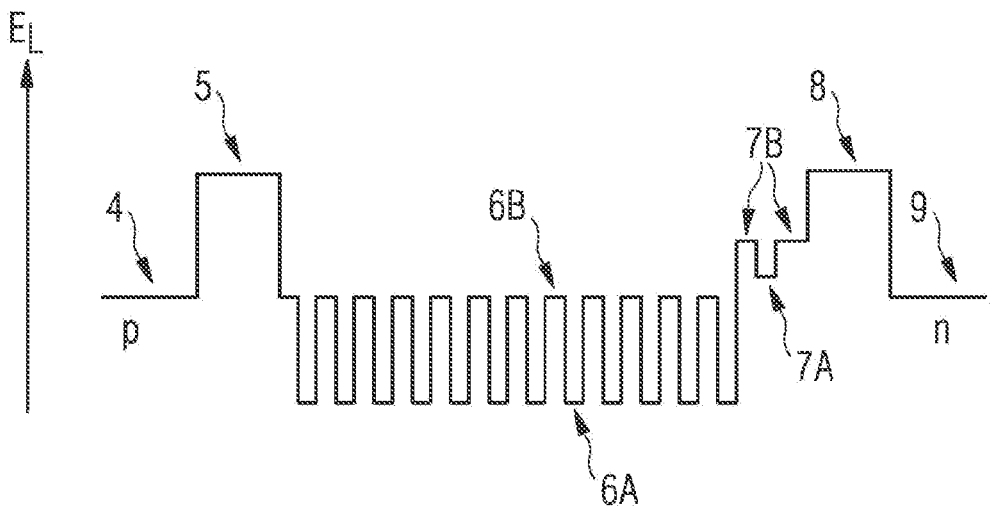
FIG. 2 shows a schematic graphical representation of the energy $E_L$ of the conduction band in an optoelectronic semiconductor chip according to the first example.

The energy $E_L$ of the edge of the conduction band $E_L$ of the example in FIG. 1 is shown schematically in FIG. 2. The further quantum well layer 7A has an advantageous larger electronic band gap and correspondingly a higher conduction band edge than the quantum well layers 6A of the multiple quantum well structure 6A, 6B. The band gap of the semiconductor materials can be adjusted in particular by varying the aluminium content and/or the indium content in the semiconductor material. For example, the quantum well layers 6A and the at least one further quantum well layer 7A may each have semiconductor materials with the composition $In_xAl_yGa_{1-x-y}As$ or $In_xAl_yGa_{1-x-y}P$ with $0 \le x \le 1$, $0 \le y \le 1$ and $x+y \le 1$, wherein the at least one further quantum well layer 7A has a higher aluminium content x and/or a lower indium content than the quantum well layers 6A.

Alternatively or additionally, the at least one further quantum well layer 7A may have a smaller thickness than the quantum well layers 6A of the multiple quantum well structure 6A, 6B. In this way, an increase in the electronic band gap can be achieved in addition to or as an alternative to changing the material composition. Preferably, the thickness of at least one additional 7A quantum well layer should not exceed 5 nm. For example, the at least one additional 7A quantum well layer has a thickness of 3 nm to 5 nm.

The barrier layers 6B and the further barrier layers 7B each have a larger electronic band gap than the adjacent quantum well layers 6A, 7A. For example, the barrier layers 6B of the multiple quantum well structure and/or the further barrier layers 7B may each have AlGaAsP. The further barrier layers 7B preferably have a larger band gap than the barrier layers 6B of the multiple quantum well structure. This can be achieved in particular by a higher aluminium content in the further barrier layers 7B.

The p-side confinement layer 5 and the n-side confinement layer 8 have an even larger electronic band gap than the quantum well layers 6A, 7A and barrier layers 6B, 7B. The confinement layers 5, 8 in particular confine charge carriers in the active layer 6. The confinement layers 5, 8 preferably contain AlGaAs.

In the example shown in FIGS. 1 and 2, the further quantum well layer 7A is arranged between the multiple quantum well structure 6A, 6B and the n-side confinement layer 8. This arrangement is advantageous because only a few holes from the p-side pass through the entire multiple quantum well structure 6A, 6B to the further quantum well layer 7A. In the further quantum well layer 7A, therefore, only little second radiation 22 is advantageously generated. The second radiation 22 that only makes visible the radiation emission of the optoelectronic semiconductor chip 20, therefore contributes only to a small extent to the power dissipation of the optoelectronic semiconductor chip 20.

Figure 3:
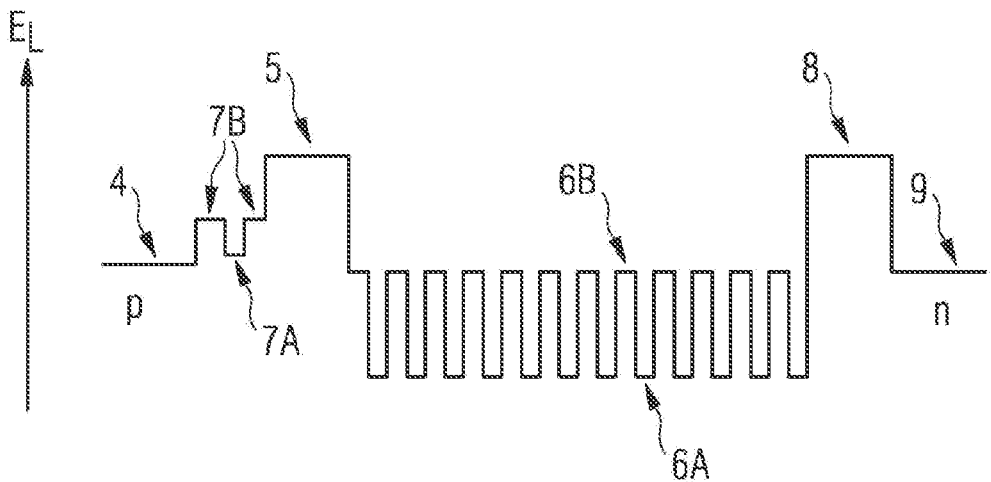
FIG. 3 shows a schematic graphical representation of the energy $E_L$ of the conduction band in an optoelectronic semiconductor chip according to a second example.

FIG. 3 shows the energy of the edge of the conduction band of a second example of the optoelectronic semiconductor chip 20 while FIG. 4 shows a schematic representation of a cross section through the optoelectronic semiconductor chip 20 according to the second example. The second example is essentially the same as the first example, but there is a difference in the arrangement of the further quantum well layer 7A.

In the second example, the further quantum well layer 7A is arranged on a side of the multiple quantum well structure 6A, 6B facing the p-type semiconductor region 4. In contrast to the first example, the further quantum well layer 7A does not adjoin the multiple quantum well structure 6A, 6B directly. Rather, the p-confinement layer 5 is arranged between the multiple quantum well structure 6A, 6B and the further quantum well layer 7A.

The p-confinement layer 5 acts in this example as an additional barrier for electrons moving from the multiple quantum well structure 6A, 6B to the further quantum well layer 7A. This additional barrier effect for electrons is advantageous because electrons within the semiconductor layer sequence have greater mobility than holes. If the further quantum well layer 7A were arranged directly on the p-side of the multiple quantum well structure 6A, 6B, comparatively many electrons and holes would reach the further quantum well layer 7A and recombine there radiatively. By the arrangement of the further quantum well layer 7A on a side of the p-confinement layer 5 facing away from the multiple quantum well structure 6A, 6B, the number of electrons present there for recombination is reduced and achieved so advantageously that only a small number of charge carriers recombine in the further quantum well layer 7A. The further quantum well layer 7A that only makes the radiation emission visible, therefore contributes only little to the power dissipation of the optoelectronic semiconductor chip 20.

Our chips are not limited by the description of the examples. Rather, this disclosure includes each new feature as well as each combination of features that in particular includes each combination of features in the appended claims, even if the feature or combination itself is not explicitly stated in the claims or examples.

This application claims priority of DE 10 2017 103 856.6, the subject matter of which is incorporated herein by reference.

The invention claimed is:

1. An optoelectronic semiconductor chip comprising:
   a p-type semiconductor region,
   an n-type semiconductor region,
   an active layer disposed between the p-type semiconductor region and the n-type semiconductor region and formed as a multiple quantum well structure and having alternating quantum well layers and barrier layers, the quantum well layers emitting a first radiation in a first wavelength range, and at least one further quantum well layer disposed outside of and directly adjoining the multiple quantum well structure that emits a second radiation in a second wavelength range, wherein the first wavelength range is in an infrared spectral range invisible to a human eye, and the second wavelength range comprises wavelengths at least partially visible to the human eye.

2. The optoelectronic semiconductor chip according to claim 1, wherein the second radiation has an intensity maximum at a wavelength of 750 nm to 850 nm.

3. The optoelectronic semiconductor chip according to claim 1, wherein the first radiation has an intensity maximum at a wavelength of 850 nm to 1000 nm.

4. The optoelectronic semiconductor chip according to claim 1, wherein the at least one further quantum well layer has an electronic band gap $E_{QW2}$ larger than an electronic band gap $E_{QW1}$ of the quantum well layers of the multiple quantum well structure, and $E_{QW2}-E_{QW1} \geq 0.1$ eV applies.

5. The optoelectronic semiconductor chip according to claim 1, wherein the quantum well layers of the multiple quantum well structure and the at least one further quantum well layer each comprise $In_xAl_yGa_{1-x-y}As$ or $In_xAl_yGa_{1-x-y}P$ with $0 \leq x \leq 1$, $0 \leq y \leq 1$ and $x+y \leq 1$.

6. The optoelectronic semiconductor chip according to claim 5, wherein aluminum content y of the at least one further quantum well layer is greater than aluminum content y of the quantum well layers of the multiple quantum well structure.

7. The optoelectronic semiconductor chip according to claim 5, wherein indium content x of the at least one further quantum well layer is smaller than indium content x of the quantum well layers of the multiple quantum well structure.

8. The optoelectronic semiconductor chip according to claim 1, wherein the at least one further quantum well layer has a thickness less than the quantum well layers of the multiple quantum well structure.

9. The optoelectronic semiconductor chip according to claim 1, wherein the at least one further quantum well layer is arranged on a side of the multiple quantum well structure facing the n-type semiconductor region.

10. The optoelectronic semiconductor chip according to claim 1, wherein the at least one further quantum well layer is disposed on a side of the multiple quantum well structure facing the p-type semiconductor region.

11. The optoelectronic semiconductor chip according to claim 10, wherein the multiple quantum well structure is disposed between a p-side confinement layer and an n-side confinement layer, and the p-side confinement layer is disposed between the multiple quantum well structure and the at least one further quantum well layer.

12. The optoelectronic semiconductor chip according to claim 1, wherein a number of the further quantum well layer(s) provided for emission of the second radiation is 1 to 3.

13. The optoelectronic semiconductor chip according to claim 1, wherein a number of quantum well layers provided for emission of the first radiation is 3 to 30.

14. The optoelectronic semiconductor chip according to claim 1, wherein a number of the quantum well layers provided for emission of the first radiation is at least five times greater than a number of further quantum well layer(s) provided for emission of the second radiation.

15. The optoelectronic semiconductor chip according to claim 1, wherein the first radiation has a power of at least 4.5 W.

16. An optoelectronic semiconductor chip comprising:
a p-type semiconductor region,
an n-type semiconductor region,
an active layer disposed between the p-type semiconductor region and the n-type semiconductor region and formed as a multiple quantum well structure and having alternating quantum well layers and barrier layers, the quantum well layers emitting a first radiation in a first wavelength range, and
at least one further quantum well layer disposed outside of and directly adjoining the multiple quantum well structure that emits a second radiation in a second wavelength range, wherein
the first wavelength range is in an infrared spectral range invisible to a human eye,
the second wavelength range comprises wavelengths at least partially visible to the human eye,
the second radiation has an intensity maximum at a wavelength of 750 nm to 850 nm,
the first radiation has an intensity maximum at a wavelength of 850 nm to 1000 nm,
a number of the further quantum well layer(s) provided for emission of the second radiation is 1 to 3, and
a number of quantum well layers provided for emission of the first radiation is 3 to 30.

* * * * *